United States Patent
Misumi et al.

(10) Patent No.: US 8,124,425 B2
(45) Date of Patent: Feb. 28, 2012

(54) METHOD FOR MANUFACTURING MAGNETIC MEMORY CHIP DEVICE

(75) Inventors: Kazuyuki Misumi, Tokyo (JP); Masahiro Shimizu, Tokyo (JP); Tsuyoshi Koga, Tokyo (JP); Tatsuhiko Akiyama, Tokyo (JP); Tomohiro Murakami, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 181 days.

(21) Appl. No.: 12/525,999

(22) PCT Filed: Feb. 21, 2008

(86) PCT No.: PCT/JP2008/052976
§ 371 (c)(1),
(2), (4) Date: Aug. 5, 2009

(87) PCT Pub. No.: WO2008/105315
PCT Pub. Date: Sep. 4, 2008

(65) Prior Publication Data
US 2010/0120176 A1 May 13, 2010

(30) Foreign Application Priority Data
Feb. 27, 2007 (JP) .................................. 2007-047822

(51) Int. Cl.
*H01L 21/00* (2006.01)
(52) U.S. Cl. ..................................... 438/3; 257/E29.323
(58) Field of Classification Search .................. 257/422, 257/E29.323
See application file for complete search history.

(56) References Cited

U.S. PATENT DOCUMENTS
| | | | |
|---|---|---|---|
| 7,057,249 B2 * | 6/2006 | Anthony et al. | 257/421 |
| 2005/0121809 A1 * | 6/2005 | Yamamoto et al. | 257/791 |

FOREIGN PATENT DOCUMENTS
| | | |
|---|---|---|
| JP | 2003-115578 | 4/2003 |
| JP | 2004-047656 | 2/2004 |
| JP | 2004-103071 | 4/2004 |
| JP | 2004-193247 | 7/2004 |
| JP | 2004-200185 | 7/2004 |
| JP | 2004-207322 | 7/2004 |
| JP | 2004-221288 | 8/2004 |
| JP | 2004-221463 | 8/2004 |
| JP | 2005-158985 | 6/2005 |
| JP | 2005-327859 | 11/2005 |
| JP | 2005-340237 | 12/2005 |

OTHER PUBLICATIONS
International Preliminary Report on Patentability, issued in corresponding International Patent Application No. PCT/JP2008/052976 dated Sep. 11, 2009.

* cited by examiner

*Primary Examiner* — Michael Lebentritt
*Assistant Examiner* — Daniel Whalen
(74) *Attorney, Agent, or Firm* — McDermott Will & Emery LLP (57) ABSTRACT

A method for manufacturing a magnetic memory chip device comprises the steps of: writing information in each of a plurality of magnetic memory chips formed on a silicon wafer; adhering a high magnetic permeability plate on a back face of the silicon wafer after writing information, the high magnetic permeability plate having a higher magnetic permeability than silicon and having a thickness of 50 μm or more; dicing the silicon wafer into respective magnetic memory chips after adhering the high magnetic permeability plate.

2 Claims, 13 Drawing Sheets

METHOD FOR MANUFACTURING MAGNETIC MEMORY CHIP DEVICE

RELATED APPLICATIONS

This application is the U.S. National Phase under 35 U.S.C. §371 of International Application No. PCT/JP2008/052976, filed on Feb. 21, 2008, which in turn claims the benefit of Japanese Application No. 2007-047822, filed on Feb. 27, 2007, the disclosures of which Applications are incorporated by reference herein.

TECHNICAL FIELD

The present invention relates to a method for manufacturing a magnetic memory chip device that can protect a magnetic memory chip from an external magnetic field in assembly steps.

BACKGROUND ART

A MRAM (Magnetic Random Access Memory) is a magnetic memory chip using a magnetoresistive effect on the basis of a spin depending conduction phenomenon characteristic of a nanomagnet, and a nonvolatile memory that can hold memories without supplying electric power from the exterior. However, the MRAM is susceptible to an external magnetic field, and if a single chip is subjected to a magnetic field of 10 [Oe] or higher, there is a possibility of malfunction, such as erroneous writing. Therefore, in a magnetic memory chip device incorporating the MRAM, techniques providing a magnetic shield that protects the MRAM from the external magnetic field have been proposed (for example, refer to Patent Documents 1 to 9).

Patent Document 1: JP-A-2003-115578
Patent Document 2: JP-A-2004-47656
Patent Document 3: JP-A-2004-103071
Patent Document 4: JP-A-2004-193247
Patent Document 5: JP-A-2004-200185
Patent Document 6: JP-A-2004-207322
Patent Document 7: JP-A-2004-221288
Patent Document 8: JP-A-2004-221463
Patent Document 9: JP-A-2005-158985

DISCLOSURE OF THE INVENTION

Problems to be Solved by the Invention

Conventional magnetic memory chip device can protect the MRAM, from the external magnetic field in the state wherein the device is completed. However, in the step of assembling the device, there has been a problem wherein the MRAM is affected by the external magnetic field generated by manufacturing equipment, such as a die-bonding machine and a wire-bonding machine, which uses motors. Therefore, it has been necessary to introduce special manufacturing equipment without the effect of magnetic field on the MRAM.

The present invention has been made to solve problems as described above, and an object thereof is to obtain a method for manufacturing a magnetic memory chip device that can protect a magnetic memory chip from an external magnetic field in assembly steps.

Means for Solving the Problems

A method for manufacturing a magnetic memory chip device comprises the steps of: writing information in each of a plurality of magnetic memory chips formed on a silicon wafer; adhering a high magnetic permeability plate on a back face of the silicon wafer after writing information, the high magnetic permeability plate having a higher magnetic permeability than silicon and having a thickness of 50 μm or more; dicing the silicon wafer into respective magnetic memory chips after adhering the high magnetic permeability plate.

EFFECT OF THE INVENTION

According to the embodiments, a magnetic memory chip can be protected from an external magnetic field in assembly steps. Thereby, even in the case using ordinary manufacturing equipment, the magnetic memory chip can be protected from the external magnetic field generated by the manufacturing equipment. Therefore, there is an advantage that change in the assembly line is not required.

DESCRIPTION OF REFERENCE NUMERALS 11 wafer (silicon wafer)
12 MRAM chip (magnetic memory chip)
15 die attach film
16 NiFe plate (high magnetic permeability plate)
17, 31 die attach film (adhesive layer)
21 die pad (lead frame)
26 wiring substrate

BEST MODE FOR CARRYING OUT THE INVENTION

First Embodiment

Figure 1:
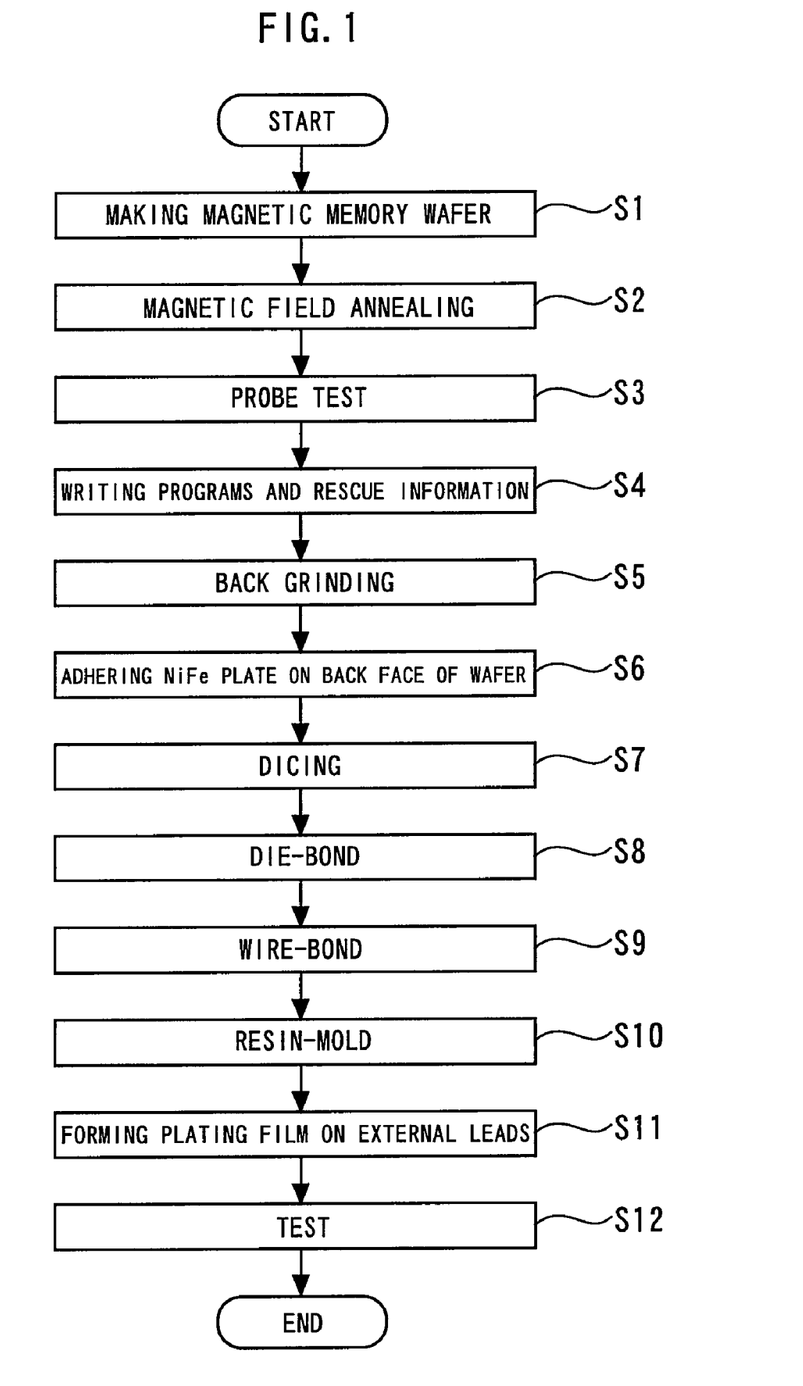
FIG. 1 Flow chart shows a method for manufacturing a magnetic memory chip device according to the first embodiment of the present invention.
Figure 2:
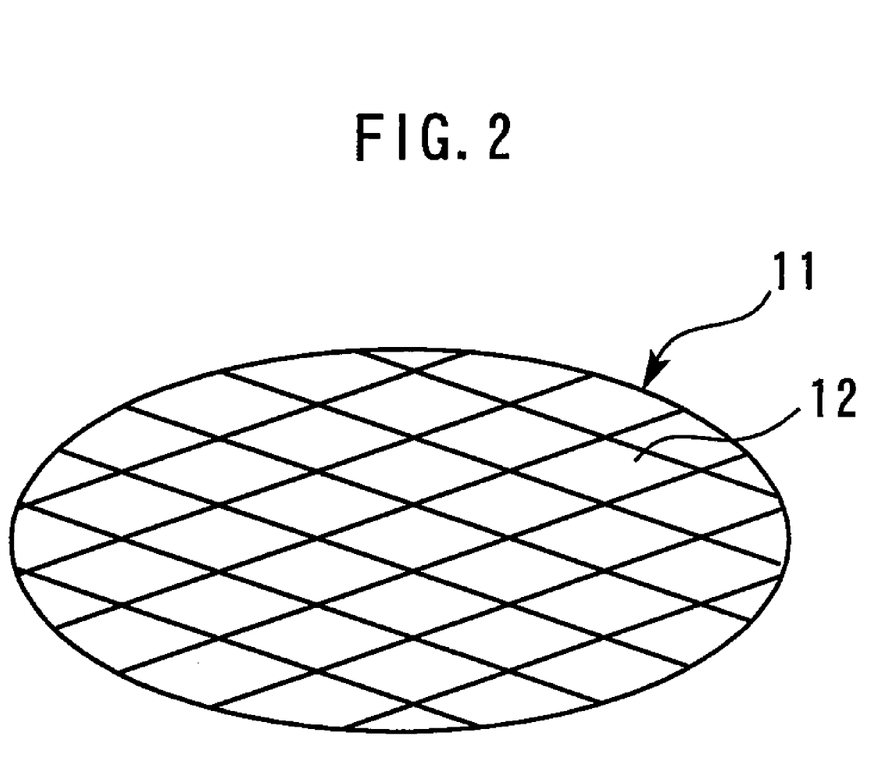
FIG. 2 Perspective view shows a process for manufacturing a magnetic memory chip device according to the first embodiment of the present invention.

A method for manufacturing a magnetic memory chip device according to the first embodiment of the present invention will be described referring to the flow chart shown in FIG. 1. First, as shown in FIG. 2, a plurality of MRAM chips (magnetic memory chip) 12 are formed on a wafer 11 composed of silicon (silicon wafer) (Step S1). As a basic structure, the MRAM chips are equipped with magnetic tunnel junction structures wherein extremely thin tunnel insulating layers are provided between a pin layer and a free layer composed of magnetic films. Such a magnetic tunnel junction structure is generally referred to as TMR (Tunneling Magneto Resistance) or MTJ (Magnetic Tunnel Junction).

The direction of magnetization in the pin layer is fixed to a constant direction. On the other hand, the direction of magnetization in the free layer can be controlled from the exterior. When the direction of magnetization in the pin layer and the direction of magnetization in the free layer are in the same direction, i.e. in the parallel state, the resistance value of the current flowing in the laminating direction of the magnetic memory element is lowered. On the contrary, when the direction of magnetization in the pin layer and the direction of magnetization in the free layer are in the opposite direction, i.e. in the anti-parallel state, the resistance value of the current flowing in the laminating direction of the magnetic memory element is elevated. Therefore, by correlating the parallel state or the anti-parallel state of the direction of magnetization with binary "0" or "1" and reading change in the resistance value, the element can be operated as a memory element in the same manner as a conventional RAM.

The MRAM chip can be classified into several types according to difference in the mechanism to control the direction of magnetization of the free layer. When the joint surface of the magnetic tunnel junction structure is defined as the XY plane and the direction perpendicular to the joint surface is defined as the Z-direction, by arranging a first line along the X-direction and a second line along the Y-direction in the vicinity of the magnetic tunnel junction structure, and independently controlling the direction of current in the first line and the second line, the direction of magnetization of the free layer can be controlled. Here, the magnetic memory element having such a mechanism is referred to as the standard MRAM.

Figure 3:
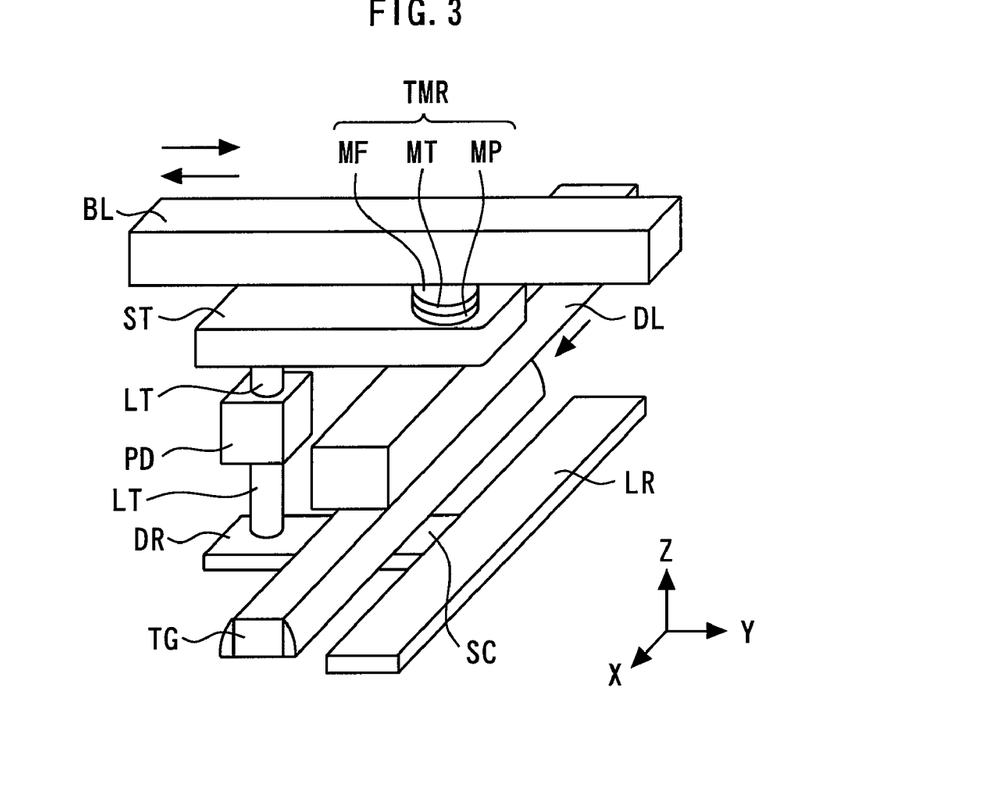
FIG. 3 Perspective view shows the standard MRAM.
Figure 4:
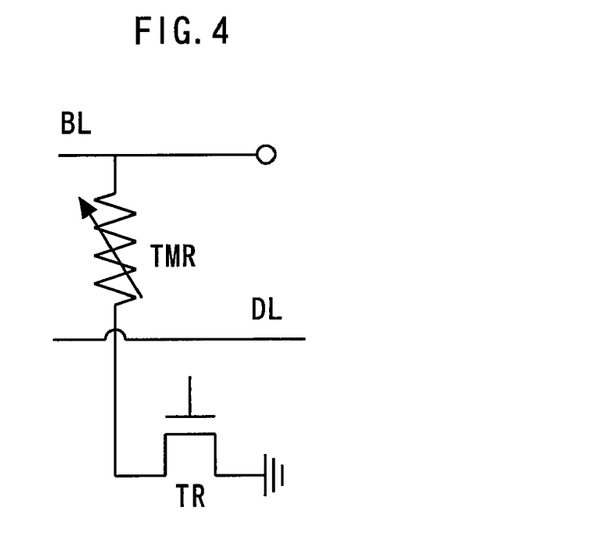
FIG. 4 Circuit diagram shows the standard MRAM.

Concerning the structure of the element, the standard MRAM requires two current lines in the vicinity of the magnetic tunnel junction as shown in FIGS. 3 and 4. Referring to FIG. 3, the magnetic tunnel junction TMR is typically configured by laminating a pin layer MP composed of a magnetic film, an extremely thin tunnel insulating layer MT, and a free layer MF composed of a magnetic film, in this order. The magnetic tunnel junction TMR has an anisotropic planar shape such as an ellipse, and the lengthwise direction becomes an easily magnetized axis. Here, the joint surface of the magnetic tunnel junction TMR is defined as the XY plane, and the direction perpendicular to the joint surface is defined as the Z-direction.

A bit line BL is located along the Y-direction so as to pass the upper vicinity of the magnetic tunnel junction TMR, and is electrically connected to the free layer MF. A digit line DL is located along the X-direction so as to pass the lower vicinity of the magnetic tunnel junction TMR. A strap ST is a wiring routed from the pin layer MP of the magnetic tunnel junction TMR in Y-direction so as to bypass the digit line DL.

Below the magnetic tunnel junction TMR, a transistor TR including a drain region DR, a gate electrode TG, and a source region SC is located. The drain region DR is electrically connected to the strap ST by wirings in the Z-direction, such as the pad PD and the interlayer wiring LT. The source region SC is electrically connected to the read line LR extending in the X-direction. The gate electrode TG also extends in the X-direction.

Next, the operation of a standard MRAM will be described. Firstly in the case of writing operation, when a current flows to the bit line BL in the Y-direction, and a current flows to the digit line DL in the X-direction, the synthetic magnetic field produced by both currents is applied to the magnetic tunnel junction TMR, and the direction of magnetization of the free layer MF is agreed to the direction of the synthetic magnetic field. Then, when a current becomes zero, the direction of magnetization of the free layer MF agrees to the first direction along the lengthwise direction of the plane shape.

On the other hand, when a current flows to the bit line BL in the—Y-direction, and a current flows to the digit line DL in the X-direction, a synthetic magnetic field is generated in the direction perpendicular to the above-described synthetic magnetic field, and the direction of magnetization of the free layer MF is agreed to the direction of the synthetic magnetic field. Then, when a current becomes zero, the direction of magnetization of the free layer MF agrees to the second direction opposite to the first direction.

By thus controlling the direction of current in the bit line BL at the same time of allowing current to flow in the digit line DL, the direction of magnetization of the free layer MF can be controlled to the first direction or the second direction, and the binary state of "0" or "1" can be stored. Thereafter, even in the state of no conduction, the direction of magnetization of the free layer MF can be maintained. As described, in the case of the MRAM of a system wherein the direction of magnetization of the free layer MF is rewritten by wiring the current-induced magnetic field, if the switching magnetic field is decreased for lowering the power consumption of the memory cell, a problem wherein the disturbance resistance to the disturbance magnetic field is lowered, is caused.

Next, in the case of reading operation, the digit line DL is not involved, and by supplying current via the route from the bit line BL through the magnetic tunnel junction TMR, the strap ST, the pad PD, the interlayer wiring LT and the transistor TR to the read line LR, and change in the resistance value of the magnetic tunnel junction TMR is detected using a sense amplifier (not shown). If the direction of magnetization of the free layer MF is in parallel to the direction of magnetization of the pin layer MP, the resistance value is lowered; and if the direction is anti-parallel to the direction of magnetization of the pin layer MP, the resistance value is elevated. Therefore, the binary state of the free layer MF is reflected by the size of the resistance value; and is read out to the exterior.

By arraying a large number of such MRAMs in a matrix, a non-volatile memory having a large capacity can be realized. In this case, since the bit line BL, the digit line DL, and the read line LR are shared, by intervening the transistor TR, matrix scanning can be realized by the gate electrode TG and the bit line BL.

The configuration of the memory cell of the MRAM is not limited to the standard MRAM type, but the present invention can be appropriately applied to the MRAM of the type using a spin implanted magnetization reversal.

Subsequently to the step for forming a plurality of MRAM chips on the wafer 11 (Step S1), magnetic field annealing is performed on the wafer 11 in a magnetic field for 4 hours at 275° C. to reset the MRAM chip 12 (Step S2).

Figure 5:
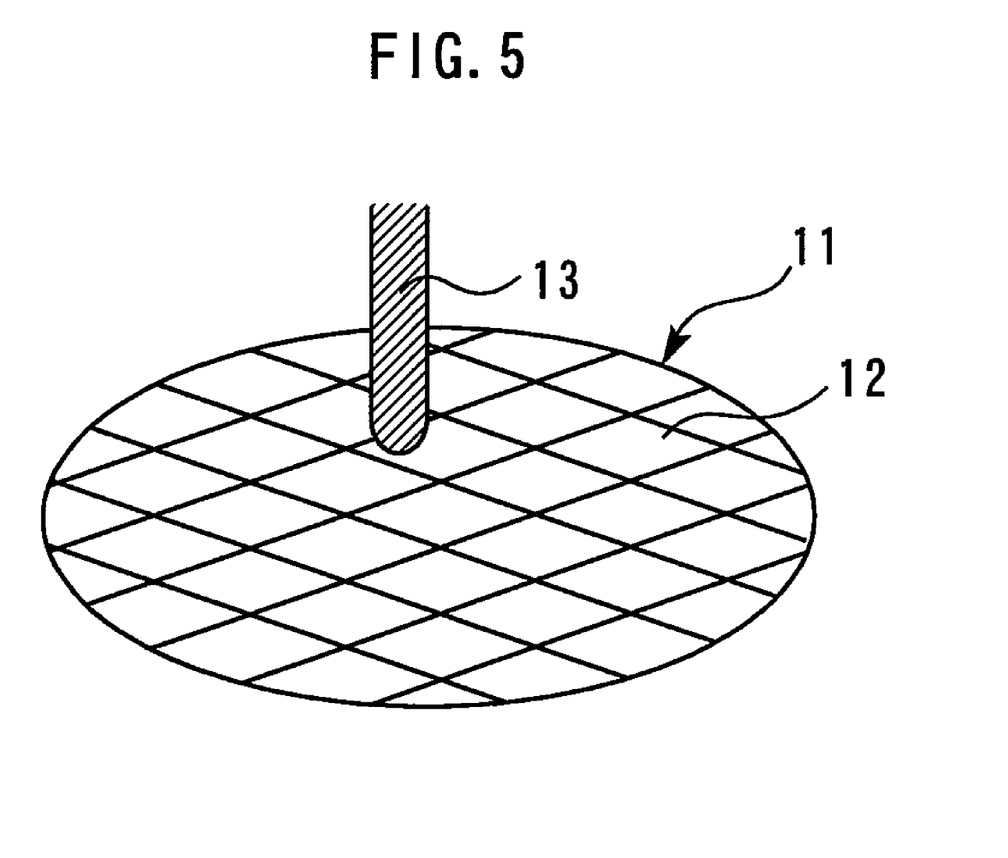
FIG. 5 Perspective view shows a process for manufacturing a magnetic memory chip device according to the first embodiment of the present invention.
Figure 6:
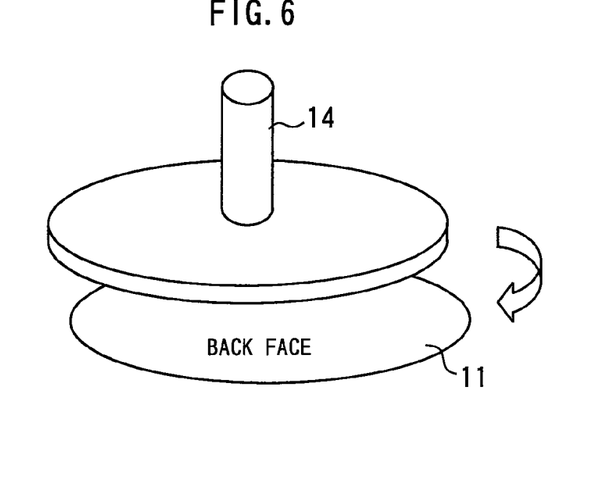
FIG. 6 Perspective view shows a process for manufacturing a magnetic memory chip device according to the first embodiment of the present invention.

Next, as shown in FIG. 5, a probe 13 is used to perform a probe test on individual MRAM chip 12 (Step S3). In the MRAM chip 12 determined as good by the probe test, programs and rescue information are written (Step S4). Then, as shown in FIG. 6, the wafer 11 is subjected to back grinding by a grinder 14 from the back face (Step S5).

Figure 7:
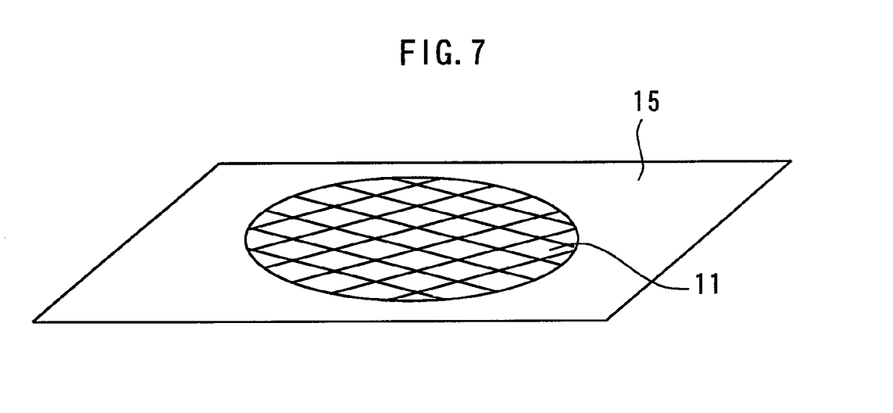
FIG. 7 Perspective view shows a process for manufacturing a magnetic memory chip device according to the first embodiment of the present invention.
Figure 8:
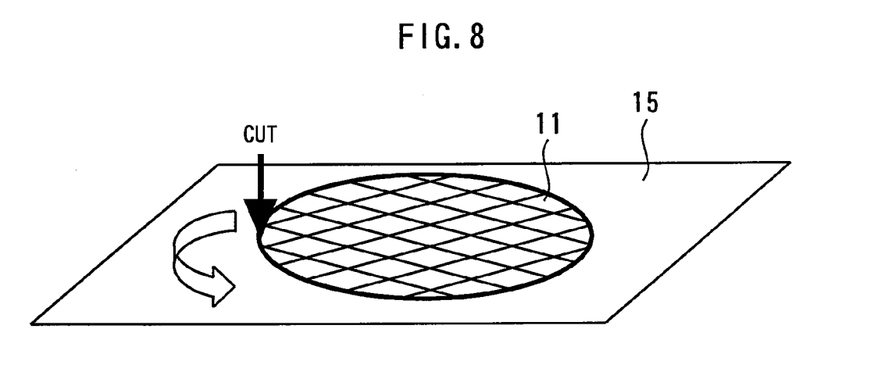
FIG. 8 Perspective view shows a process for manufacturing a magnetic memory chip device according to the first embodiment of the present invention.
Figure 9:
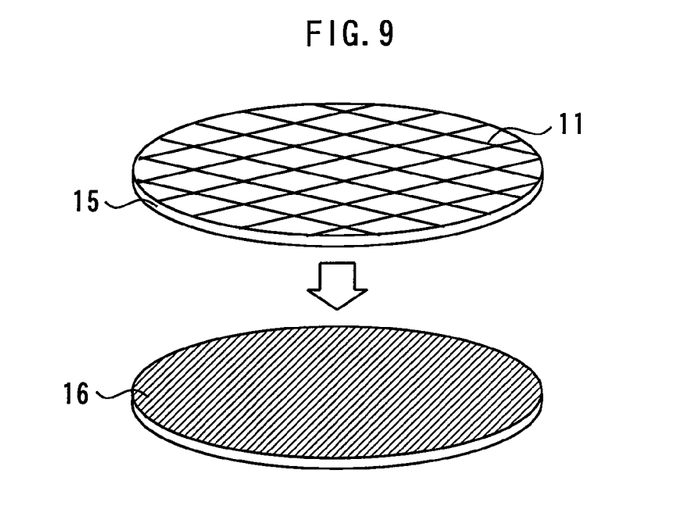
FIG. 9 Perspective view shows a process for manufacturing a magnetic memory chip device according to the first embodiment of the present invention.

Next, as shown in FIG. 7, the wafer 11 is adhered to the die attach film 15. As shown in FIG. 8, the die attach film 15 is cut along the periphery of the wafer 11. Then, as shown in FIG. 9, an NiFe plate (high magnetic permeability plate) 16 having a thickness of 100 μm is adhered on the back face of the wafer 11 via a die attach film 15 (Step S6). The die attach film 15 is cured by heating at 150° C.

Figure 10:
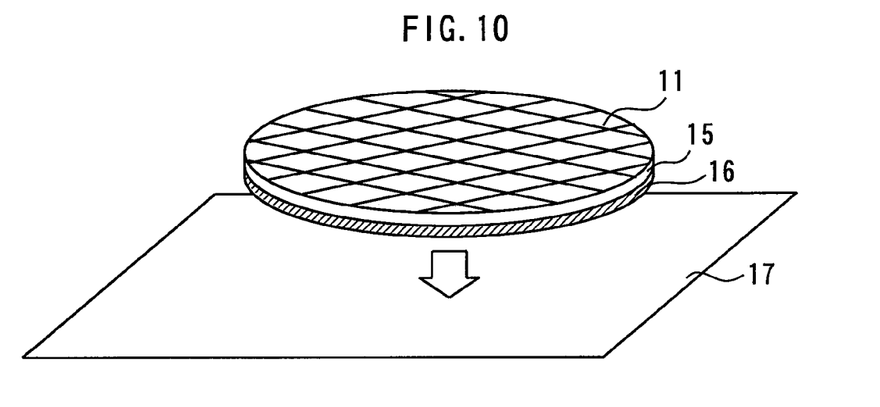
FIG. 10 Perspective view shows a process for manufacturing a magnetic memory chip device according to the first embodiment of the present invention.
Figure 11:
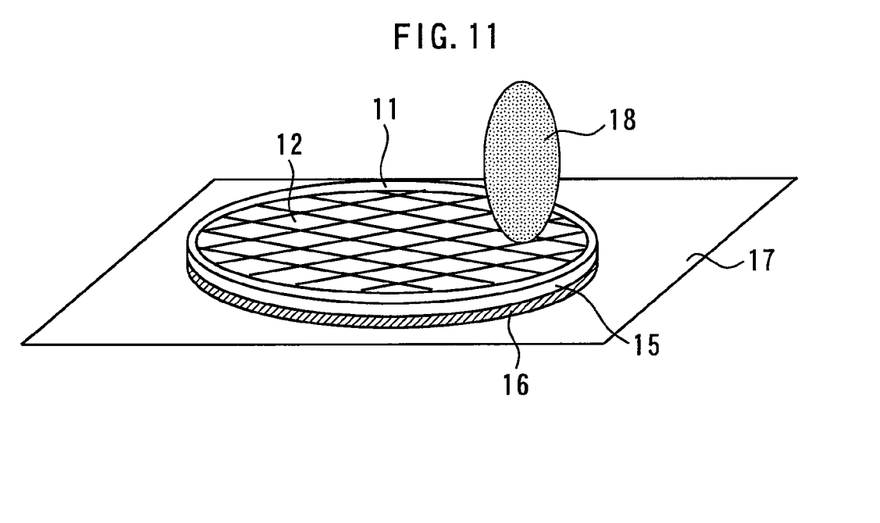
FIG. 11 Perspective view shows a process for manufacturing a magnetic memory chip device according to the first embodiment of the present invention.

Next, as shown in FIG. 10, a die attach film 17 (adhesive layer) is adhered to the laminated wafer 11 and the NiFe plate 16. Then, as shown in FIG. 11, a wafer 11 is diced into respective MRAM chips 12 using a dicing blade 18 (Step S7). Thereafter, cleaning is performed.

Figure 12:
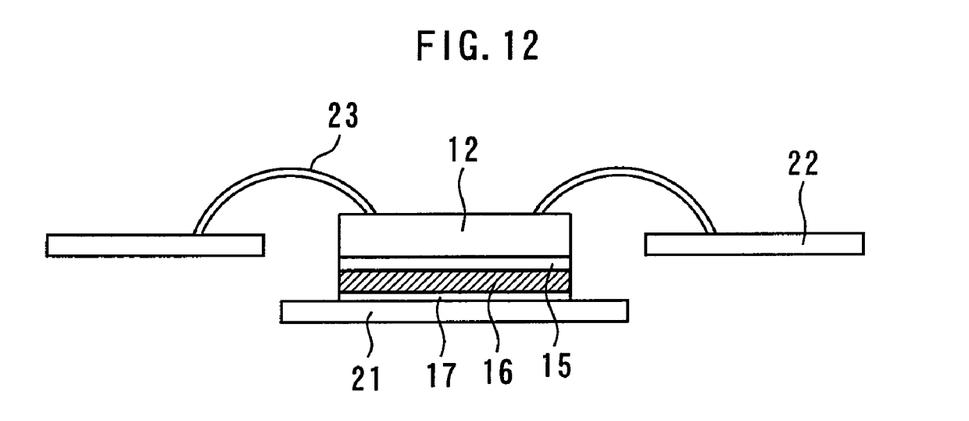
FIG. 12 Sectional view shows a process for manufacturing a magnetic memory chip device according to the first embodiment of the present invention.
Figure 13:
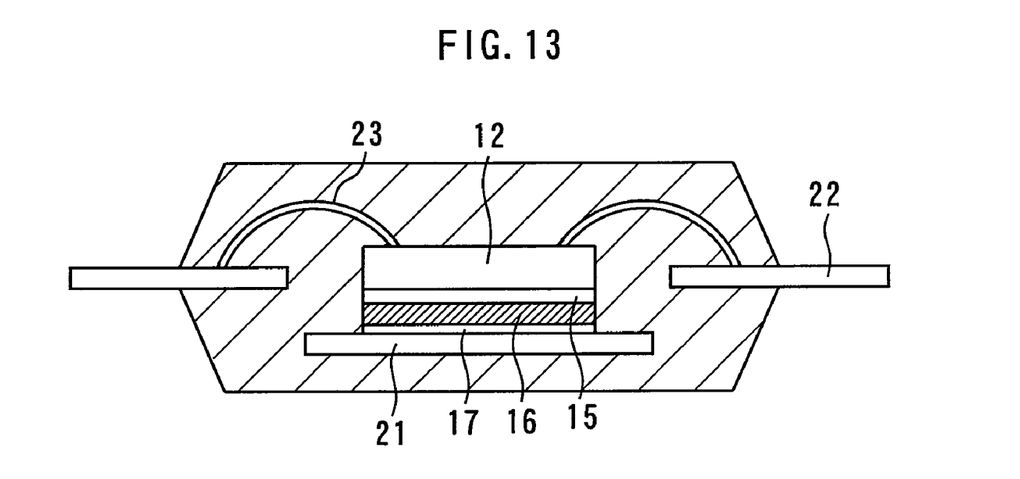
FIG. 13 Sectional view shows a process for manufacturing a magnetic memory chip device according to the first embodiment of the present invention.

Next, as shown in FIG. 12, each MRAM chip 12 is die-bonded onto a die pad 21 via a die attach film 17 (Step S8). The die attach film 17 is cured by heating to 150° C. The MRAM chip 12 is wire-bonded to external leads 22 using gold wires 23 (Step S9). Then, as shown in FIG. 13, the MRAM chip 12 and the gold wires 23 are resin-molded by a resin 24 (Step S10).

Figure 14:
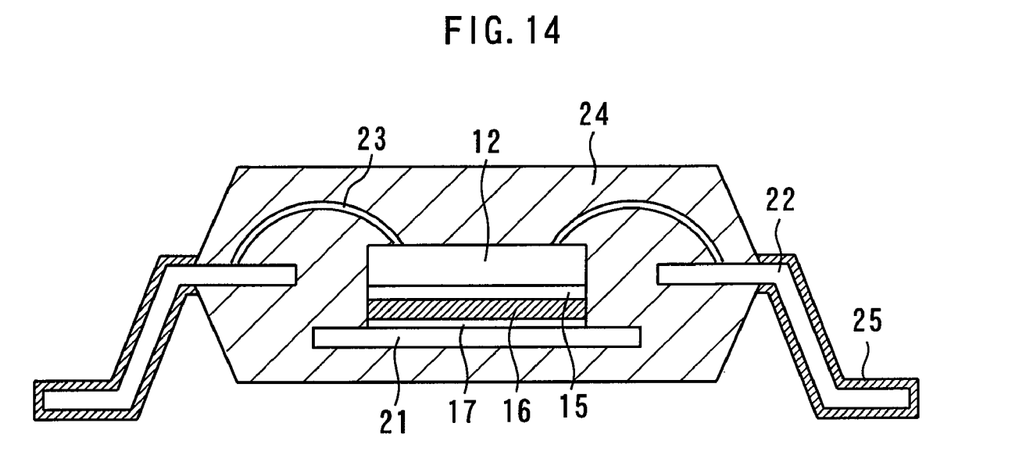
FIG. 14 Sectional view shows a process for manufacturing a magnetic memory chip device according to the first embodiment of the present invention.

Next, as shown in FIG. 14, an Ni/Pd/Au laminated plating film 25 is formed on the surface of the external leads 22 composed of Cu by electric-field plating (Step S11). The external leads 22 are also molded. Finally, the test for the manufactured magnetic memory chip device is conducted (Step S12).

As described above, in the first embodiment, an NiFe plate 16 formed of a substance having a higher magnetic permeability than silicon is adhered to the back face of the wafer 11 in the middle of the assembly step. Thereby, the magnetic field line from the exterior passes mainly through the NiFe plate 16, and can reduce the quantity of the magnetic field line passing through the MRAM chip 12 composed of silicon. Therefore, in the subsequent assembly step, the MRAM chip 12 can be protected from external magnetic field. Specifically, the MRAM chip 12 can be protected from external magnetic field generated by the dicing machine, the die bonding machine, and the wire bonding machine. Therefore, special machines prepared for preventing external magnetic field are not required as these manufacturing machines, and ordinary manufacturing machines can be used. However, it is effective for the back grinding machine to employ measures for preventing external magnetic field.

In electric-field plating, the effect of external magnetic field especially causes a problem, since an NiFe plate 16 has been previously adhered to the MRAM chip 12, the MRAM chip 12 can be protected from external magnetic field. However, the use of a lead frame wherein a plating film has been previously formed is more preferable because electric-field plating after resin molding becomes unnecessary.

Figure 15:
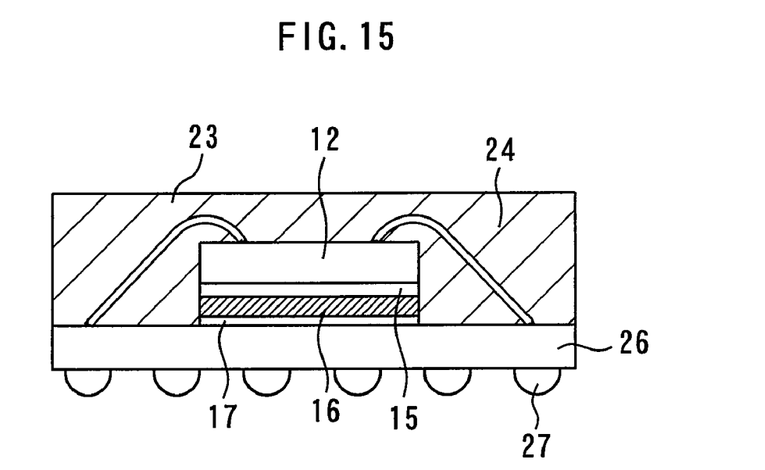
FIG. 15 Sectional view shows another example of a magnetic memory chip device according to the first embodiment of the present invention.

In the above example, although the case of a QFP (Quad Flat Package) type package has been described, the first embodiment is not limited thereto, but can also be applied to a BGA (Ball Grid Array) type package as shown in FIG. 15. In this case, the MRAM chip 12 to which the NiFe plate 16 is adhered is mounted on the wiring substrate 26. Then, solder balls 27 are formed on the under face of the wiring substrate 26.

Although the case wherein the thickness of the NiFe plate 16 is 100 μm has been described, the first embodiment is not limited thereto, but if the thickness of the NiFe plate 16 is 50 μm or more, the MRAM chip 12 can be protected from external magnetic field. However, the thickness of the NiFe plate 16 is preferably 100 μm or more. If such a thick NiFe plate 16 is formed on the wafer 11 in the preceding step, there is a problem wherein the wafer 11 warps due to the stress. However, in the first embodiment, since the NiFe plate 16 separately formed in the subsequent step is adhered on the wafer 11 after forming the MRAM chip 12, such a problem can be reduced as much as possible.

It is also preferable that the thickness of the die attach film 17 is 10 μm or more. Thereby, the stress generated by the difference in coefficient of thermal expansion between the MRAM chip 12 and the NiFe plate 16 is relieved by the die attach film 17. On the other hand, it is preferable that the thickness of the die attach film 17 is 40 μm or less. Thereby, since the distance between the MRAM chip 12 and the NiFe plate 16 is shortened, the shielding effect against external magnetic field is enhanced.

In order to relieve stress due to the difference in the coefficient of thermal expansion, a dummy silicon chip may be provided between the NiFe plate 16 and the MRAM chip 12. Alternatively, another semiconductor chip may be connected as a flip-chip on the MRAM chip 12. Alternatively, instead of the NiFe plate 16, a material, such as base Si subjected to treatment against disturbance magnetic field, may be joined as the SOI. Furthermore, in order to protect written information, it is preferable that the step after writing programs and rescue information in the MRAM chip 12 is a low-temperature process of 300° C. or lower. However, it is more preferable that the temperature is not higher than the process temperature for magnetic field annealing.

Alternatively, the NiFe plate 16 may be adhered on the surface of the MRAM chip 12. In this case, the die attach film 15 and the NiFe plate 16 must be adhered avoiding wire bonding pads by forming openings on the locations of the wire bonding pads on the surface of the MRAM chip 12, or by lengthening in a plate shape. However, an adhesive strength is required to the extent that the die attach film 17 is not peeled off by the water pressure or the like in the subsequent dicing step.

Second Embodiment

Figure 16:
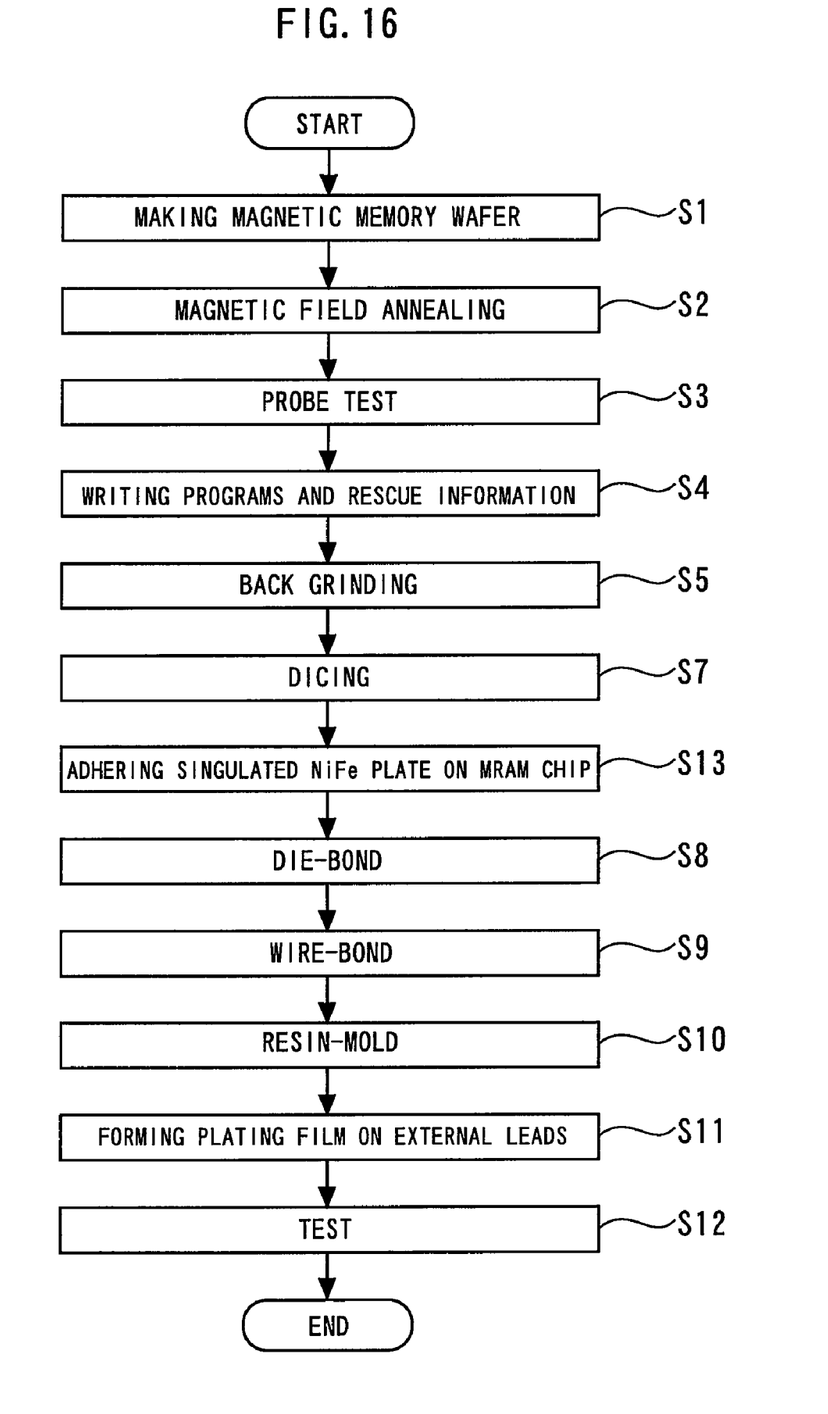
FIG. 16 Flow chart shows a process for manufacturing a magnetic memory chip device according to the second embodiment of the present invention.
Figure 17:
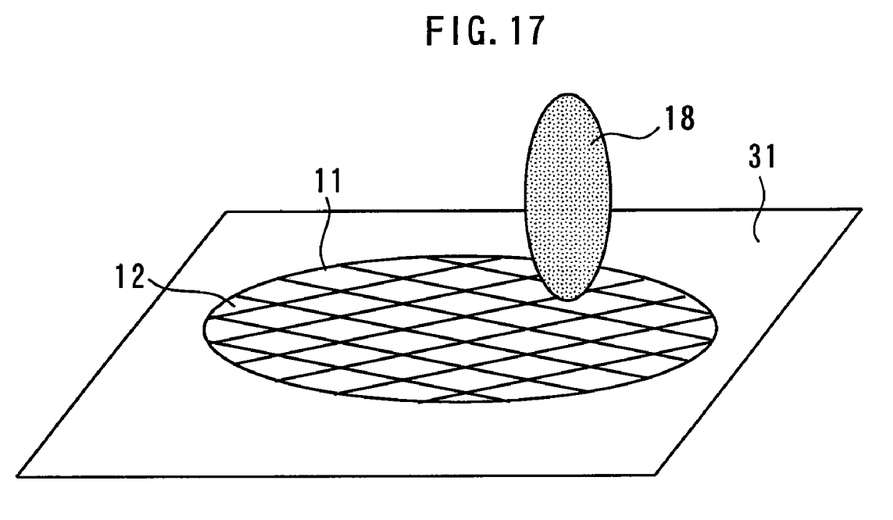
FIG. 17 Perspective view shows a process for manufacturing a magnetic memory chip device according to the second embodiment of the present invention.

A method for manufacturing a magnetic memory chip device according to the second embodiment of the present invention will be described referring to the flow chart shown in FIG. 16. First, steps to Step S5 are conducted in the same manner as in the first embodiment. Next, as shown in FIG. 17, the wafer 11 is adhered to the die attach film 31, and the wafer 11 is diced to respective MRAM chips 12 using a dicing blade 18 (Step S7). Thereafter, cleaning is performed.

Figure 18:
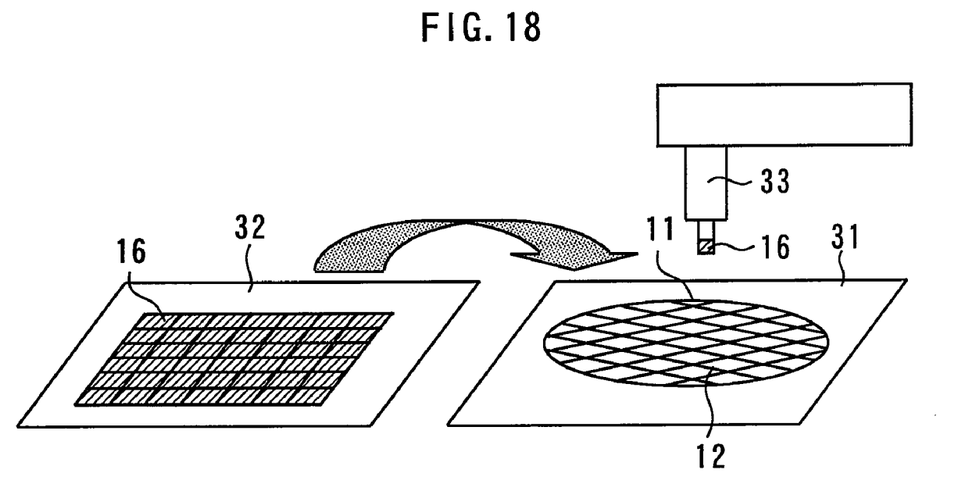
FIG. 18 Perspective view shows a process for manufacturing a magnetic memory chip device according to the second embodiment of the present invention.
Figure 19:
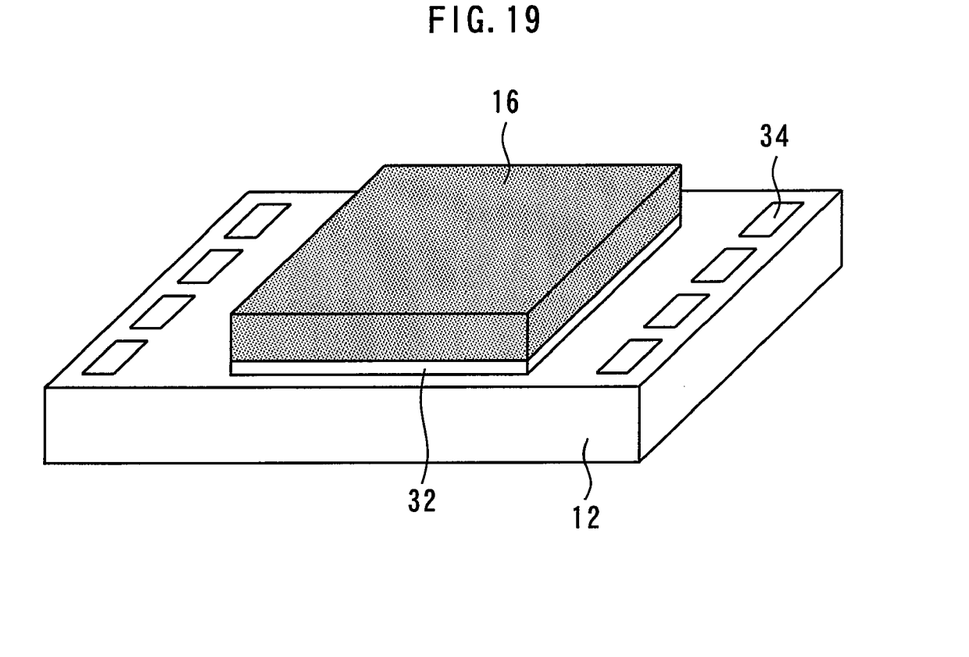
FIG. 19 Perspective view shows a process for manufacturing a magnetic memory chip device according to the second embodiment of the present invention.

Next, as shown in FIG. 18, an NiFe plate 16 is adhered to a die attach film 32 to singulate the plate. Then, the singulated NiFe plate 16 is adhered on the individual MRAM chip 12 of the diced wafer 11 via the die attach film 32 using a die bonding head 33 (Step S13). At this time, as shown in FIG. 19, the NiFe plate 16 is made not to contact the wire bonding pad 34 of the MRAM chip 12.

Figure 20:
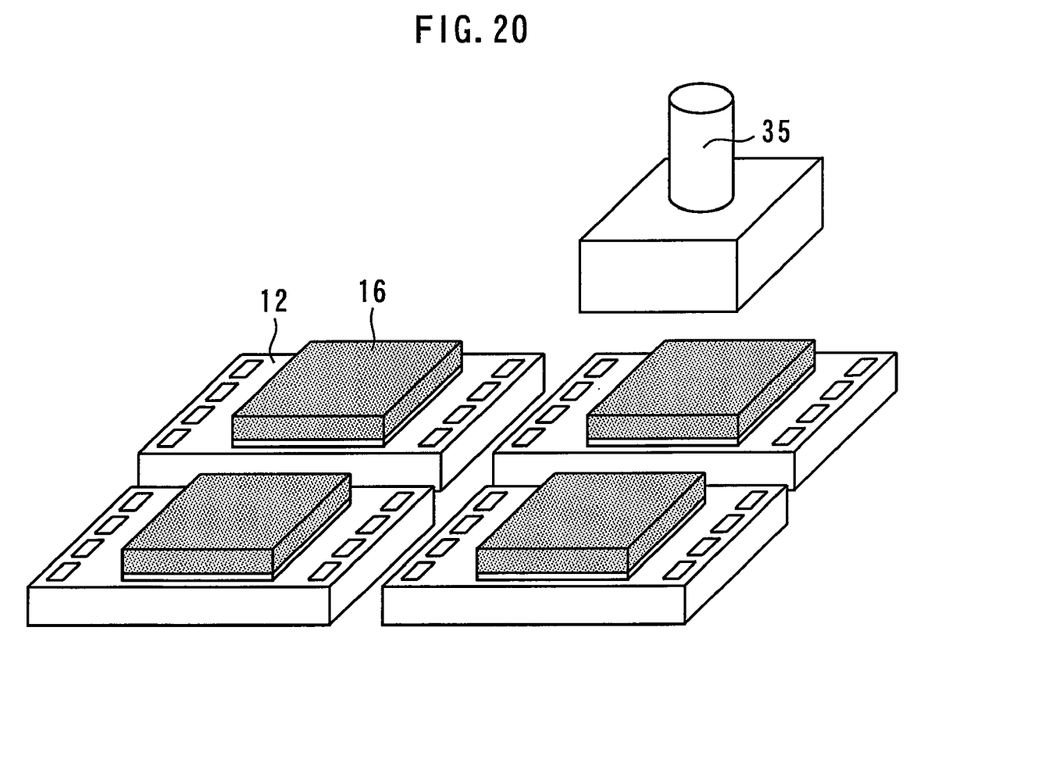
FIG. 20 Perspective view shows a process for manufacturing a magnetic memory chip device according to the second embodiment of the present invention.

Next, as shown in FIG. 20, each of the laminated MRAM chip 12 and NiFe plate 16 is picked up by a die-bond pick-up collet 35 and die-bonded on the lead frame or the wiring substrate via the die attach film 31 (Step S8). The die attach films 31 and 32 are cured by heating to 150° C.

Thereafter, in the same manner as in the first embodiment, steps of Steps S9 to S12 are conducted. The NiFe plate may be adhered in advance on the lead frame or the wiring substrate, and a MRAM chip, on which an NiFe plate is adhered, is adhered thereon to be a sandwich structure.

As described above, in the second embodiment, an NiFe plate 16 formed of a substance having a higher magnetic permeability than silicon is adhered to the back face of the wafer 11 in the middle of the assembly step. Thereby, in the subsequent assembly step, the MRAM chip 12 can be protected from external magnetic field. Specifically, the MRAM can be protected from external magnetic field generated by the die bonding machine and the wire bonding machine. Therefore, special machines prepared for preventing external magnetic field are not required as these manufacturing machines, and ordinary manufacturing machines can be used. However, the countermeasure to prevent external magnetic field is required for the back grinding machine, the dicing machine, and the die bonding machine for adhering the singulated NiFe plate on the wafer.

Third Embodiment

Figure 21:
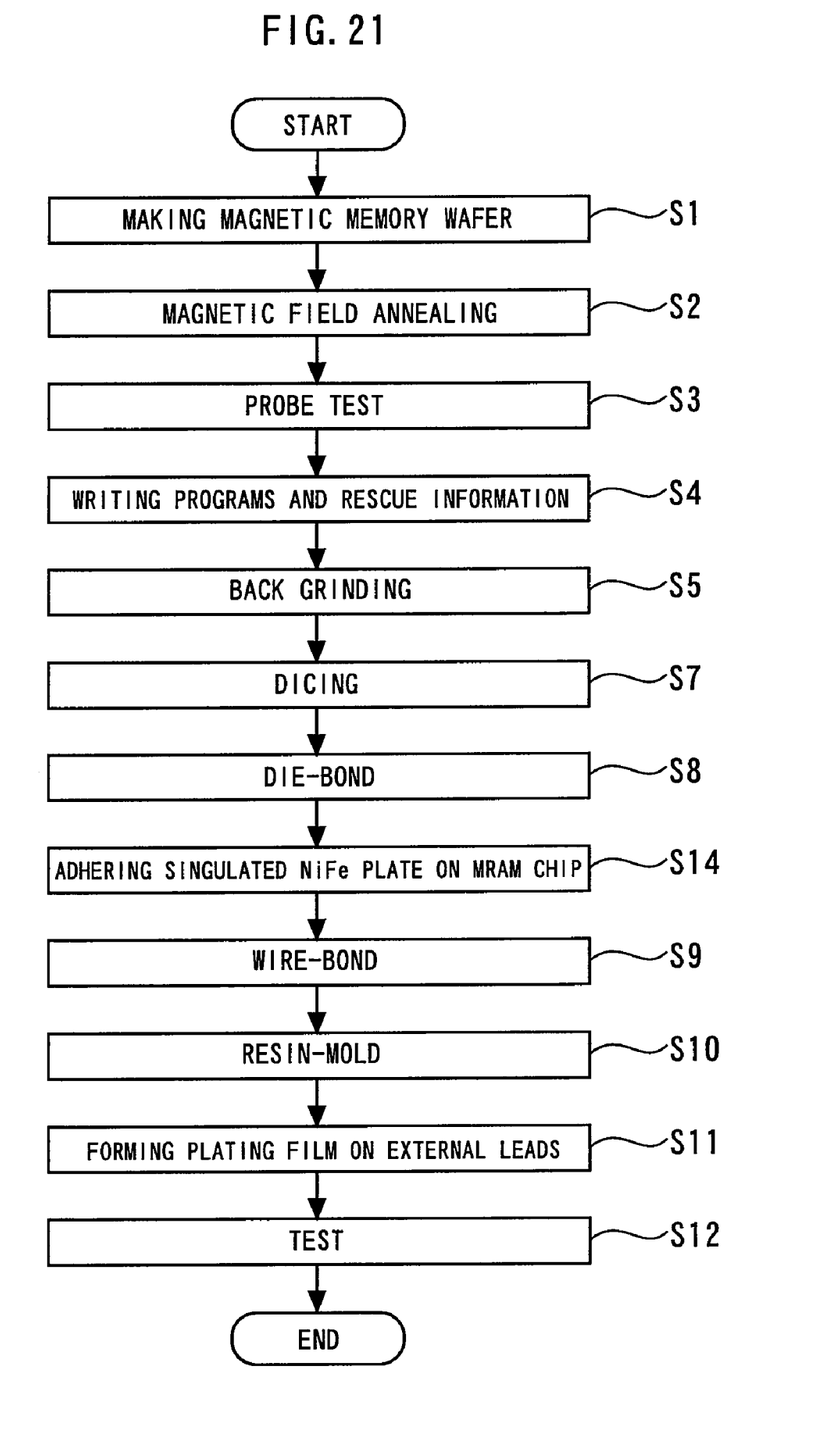
FIG. 21 Flow chart shows a process for manufacturing a magnetic memory chip device according to the third embodiment of the present invention.
Figure 22:
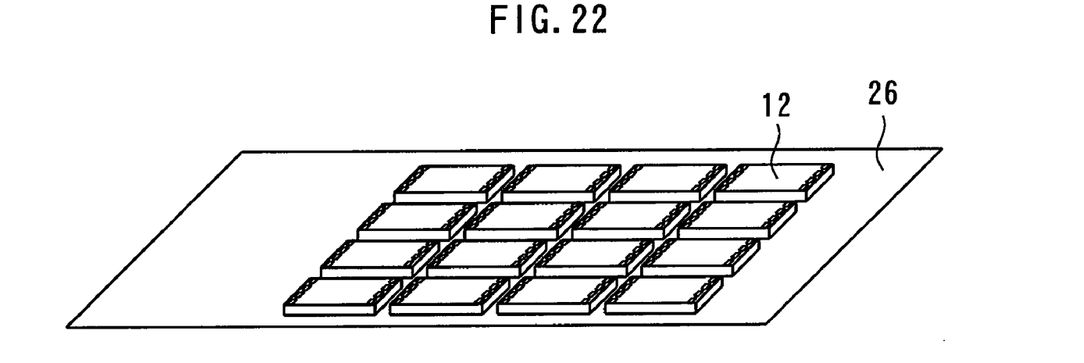
FIG. 22 Perspective view shows a process for manufacturing a magnetic memory chip device according to the third embodiment of the present invention.

A method for manufacturing a magnetic memory chip device according to the third embodiment of the present invention will be described referring to the flow chart shown in FIG. 21. First, steps to Step S5 are conducted in the same manner as in the first embodiment. Next, the wafer 11 is diced to respective MRAM chips 12 (Step S7), and as shown in FIG. 22, the MRAM chip 12 is die-bonded on the wiring substrate 26 (Step S8). The MRAM chip 12 may be die-bonded on the lead frame.

Figure 23:
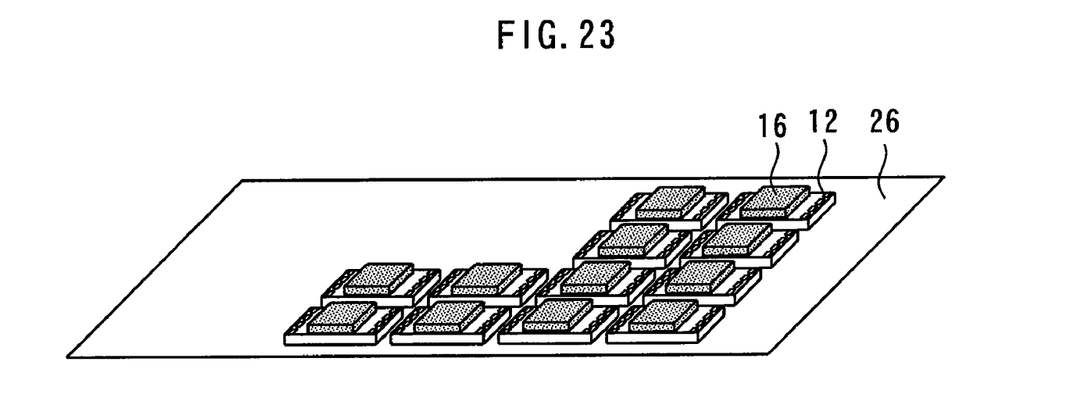
FIG. 23 Perspective view shows a process for manufacturing a magnetic memory chip device according to the third embodiment of the present invention.

Next, as shown in FIG. 23, the singulated NiFe plate 16 is adhered on each MRAM chip 12 (Step S14). At this time, the NiFe plate 16 is made not to contact the wire bonding pad of the MRAM chip 12. Thereafter, in the same manner as in the first embodiment, steps of Steps S9 to S12 are conducted. The NiFe plate may be adhered in advance on the lead frame or the wiring substrate, and a MRAM chip, on which an NiFe plate is adhered, is adhered thereon to be a sandwich structure.

As described above, in the third embodiment, an NiFe plate 16 formed of a substance having a higher magnetic permeability than silicon is adhered to the back face of the wafer 11 in the middle of the assembly step. Thereby, in the subsequent assembly step, the MRAM chip 12 can be protected from external magnetic field. Specifically, the MRAM can be protected from the external magnetic field generated from the wire bonding machine by spark or the like. Therefore, special machines prepared for preventing external magnetic field are not required as the wire bonding machines, and ordinary manufacturing machines can be used. However, the countermeasure to prevent external magnetic field is required for the back grinding machine, the dicing machine, and the die bonding machine.

INDUSTRIAL APPLICABILITY

According to the embodiments, the magnetic memory chip can be protected from external magnetic field in the assembly step. Thereby, even when ordinary manufacturing equipment is used, the magnetic memory chip can be protected from external magnetic field generated from such manufacturing equipment. Therefore, the advantage wherein no change in the assembly line is required can be obtained.

What is claimed is:

1. A method for manufacturing a magnetic memory chip device comprising the steps of:
    preparing a silicon wafer having a plurality of magnetic memory chips, the silicon wafer having a predetermined thickness;
    writing information in each of the plurality of magnetic memory chips of the silicon wafer;
    after the step of writing information, back-grinding the silicon wafer to reduce the predetermined thickness of the silicon wafer;
    after the step of back-grinding, adhering a high magnetic permeability plate on a back face of the silicon wafer having the reduced thickness by the back-grinding, the high magnetic permeability plate having a higher magnetic permeability than silicon and having a thickness of 50 μm or more;
    dicing the silicon wafer into respective magnetic memory chips after adhering the high magnetic permeability plate.

2. The method for manufacturing a magnetic memory chip device as claimed in claim 1, wherein the thickness of the high magnetic permeability plate is 100 μm or more.

* * * * *